United States Patent [19]
Korn et al.

[11] 4,029,521
[45] June 14, 1977

[54] THERMOELECTRIC DETECTOR

[75] Inventors: Uzi Korn; Shmuel Shtrickman, both of Rehovot, Israel

[73] Assignee: Yeda Research & Development Co. Ltd., Rehovot, Israel

[22] Filed: Oct. 3, 1975

[21] Appl. No.: 619,687

[30] Foreign Application Priority Data
Oct. 4, 1974  Israel .................................... 45788

[52] U.S. Cl. ................................................ 136/225
[51] Int. Cl.² .......................................... H01L 35/02
[58] Field of Search .................................... 136/225

[56] References Cited
UNITED STATES PATENTS

| | | |
|---|---|---|
| 3,267,727 | 8/1966 | Benzinger .......................... 136/225 |
| 3,535,523 | 10/1970 | Wunderman et al. .............. 136/225 |
| 3,761,318 | 9/1973 | McHenry .......................... 136/225 |

*Primary Examiner*—Maynard R. Wilbur
*Assistant Examiner*—Richard E. Berger
*Attorney, Agent, or Firm*—Browdy and Neimark

[57] ABSTRACT

A fast thermoelectric detector comprising a plurality of thermocouple junctions deposited on an inert supporting surface, said thermocouples being connected in series, the arrangement being such that an equal number of hot junctions and of cold junctions are distributed in a substantially uniform manner per unit area of the entire active area of the detector covered with thermocouple junctions. The thermocouples are advantageously arranged in a meandering path in a plurality of rows.

4 Claims, 6 Drawing Figures

FIGURE 4

THERMOELECTRIC DETECTOR

The present invention relates to fast thermoelectric detectors. More particularly, the invention relates to novel fast thermoelectric detectors comprising a plurality of at least some hundreds of couples of coatings of dissimilar thermocouple materials on a suitable substrate, arranged in a meandering path and connected in series. According to a preferred embodiment of the invention means are provided for shading predetermined portions of the said coatings and/or blackening strips or means for preferential focusing the radiation, possibly in conjunction with suitable cold-sinks. Other and further aspects of the invention will become apparent hereinafter.

BACKGROUND OF THE INVENTION:

There are known many types of thermal detectors, such as thermoelectric detectors, bolometers, pyroelectric detectors and the like, which are based on the measurement of a change of some temperaturedependent property of the detector material which is induced by the radiation to be measured, and which is transformed into an output signal which is measured.

Thermocouples and thermopiles are used for the detection and measurement of electromagnetic radiation, especially in the I.R. range. These are based on the thermoelectric e.m.f. induced by the rise of temperature caused by said radiation. These devices are used for low chopping frequencies in the range of subaudio and low audio frequencies. As for high frequencies, the sensitivity of such devices drops rapidly and approaches zero. Fast thermocouples and bolometers, for the $10^7$ to $10^9$ Hz range have been proposed by Block et al., IEEE Q.E. (1973) 1044 and Contreras et al., Appl. Phys. Lett. 17, (1970) 450. Such devices make use of thin films deposited on a heat-conducting substrate. The known devices suffer from the drawback of low responsivity (about $10^{-5}$ to $10^{-4}$ V/W). With pyroelectric detectors, the response time can be varied by the provision of a resistor connected in series with the detector, see Laser Focus, July 1973. An increase of frequency with such devices brings about a moderate decrease in sensitivity. The sensentivity of pyroelectric detectors decreases as the square root of the response time.

SUMMARY OF THE PRESENT INVENTION

According to the present invention there is provided a novel type of thermopile comprising a plurality of junctions. Preferably there are provided at least some hundreds, in some cases even $10^3 - 10^4$ or more junctions arranged in series, and advantageously in a pattern to be described. The novel thermoelectric detectors of the present invention are characterized by a fast response and by adequate sensitivity. The novel detectors can be used for the detection of high frequency electromagnetic radiation from the microwave region and higher; preferably in the I.R. and submillimeter regions. The novel thermoelectric detector according to the invention can be used for heterodyne detection in these regions. Hitherto cooled quantum detectors or pyroelectric detectors or bolometers were used for this purpose.

The novel thermoelectric detector according to the present invention comprises a plurality of thin coatings, of the order of 100 A to about 1 micron thickness, of two suitable thermoelectrically dissimilar materials A and B on a suitable substrate C, said coatings forming a plurality of thermocouple junctions, said junctions being interconnected in series and being arranged on a supporting surface in a pattern defining a meandering path of consecutive cold, hot, cold, hot, etc. junctions. Said hot and cold junctions are similar in shape, size, and distances from one another, so that hot and cold junctions are mixed together in the sensitive area of the detector, the distance between neighbor hot and cold junctions being approximately equal to neighbor hot-hot or cold-cold junction distances. The coating of the two said thermoelectric materials A and B may be in the form of many slightly overlapping rectangles of consecutive order A, B, A, B, . . . etc. connected in a meandering path so that the overlap regions constitute the junctions. Alternatively, the coatings may be also be arranged so that material A forms a continous meandering path and material B is placed on it or under it in the form of many separated rectangles. Material B, having a lower electrical resistivity, will be thermoelectrically dominant where it is present, forming junctions with material A at both ends of each rectangle.

In addition, there are included at least some, or all, of the following:

a. A plurality of reflective means E positioned selectively above the cold-junctions of A-B;

b. A thin transparent insulating layer D between the junctions A-B and the reflective means E;

c. A heat sink F of a suitable thermally conducting material arranged close to the cold-junctions of A-B, separated from the hot-junctions by suitable means such as tunnels or insulating means;

d. A cover G of material having high radiation absorption positioned above the hot-junctions of A-B.

e. Instead of the material E, or in conjuction therewith, there can be used means adapted to focus the incoming radiation on the hot-junctions. Such means can be suitable plane-concave transparent members adapted to focus the radiation onto the said hot-junctions.

According to the preferred embodiment of the invention the meandering thermopile path consists of a plurality of rows wherein the centers of the rectangular coatings of the thermoelectric material B are located relative to each other in a geometrical arrangement similar to that of the white squares of a chess board. Material A may be also of the form of separate rectangles corresponding to the black squares of a chess board or it may form a continuous path. Also, according to the preferred embodiment of the invention at least some, or all, of the above mentioned items a,c, and e concerning the reflective means the heat sink and tunnels and focusing means are of the form of parallel strips, geometrically forming a grid pattern.

For example, with the novel device, the following, three modes of operation are possible:

a. An energy Meter. (Joulemeter).

In this mode the radiation signals are shorter than the response time of the detector, but given as pulses with a long delay between them. (The delay should be much longer than the response time). In this case the detector integrates the power output (since it does not have time to lose any heat created by the radiation pulse). The resulting signal is proportional to the energy of the pulse. During the delay time between the pulses, the signal decays and the detector is ready for the next pulse. The thermopile of this invention is very efficient in this mode of operation since the "hot" and "cold" junctions of the thermopile are created by a transient temperature distribution in which no heat is lost during the time of the measurement. In this case one gets responsivity of $10^4$ volt/joule and energies as low as $3.10^{-10}$ Joule can be measured. This corresponds to pulses shorter than 10μsec, with repetition rate up to 10 kHz.

b. A Power Meter.

For this mode the the input power changes are much slower than the response time. In this case the detector measures the power of the incident radiation. For the detector of this invention for 1MHzoperation one possible design gives a responsivity of 2 volt/watt with NEP of $5.10^{-9}$ watt/$Hz^{1/2}$.

c. A mixer for Heterodyne Detection System.

In this mode the sensitivity of the detector is very high and depends on the local oscillator power.

The novel detectors according to the present invention are described by way of example only with reference to the enclosed schematical drawings in which.

Figure 1:
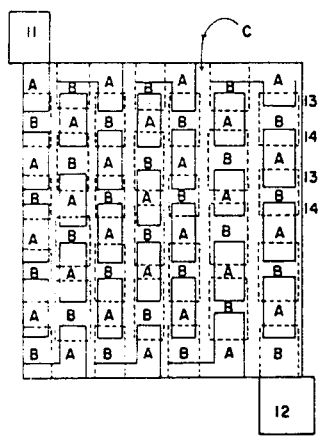
FIG. 1 is a schematical top view of the detector coatings where both materials are in the form of rectangles placed corresponding to a chess board pattern.
Figure 2:
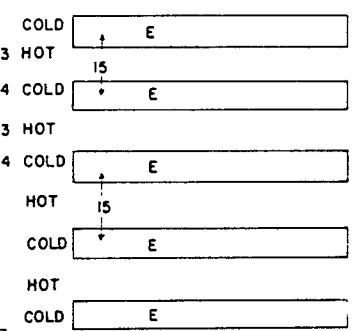
FIG. 2 illustrates the location of reflecting strips provided in a device of FIG. 1.
Figure 3:
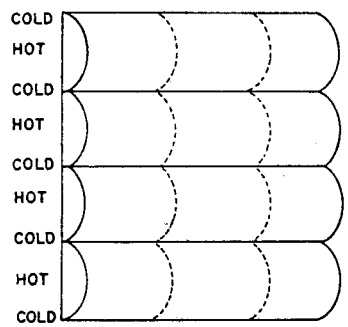
FIG. 3 illustrates the location and shape of transparent cylindrical lenses used as means to focus the incoming radiation on the hot junctions.
Figure 4:
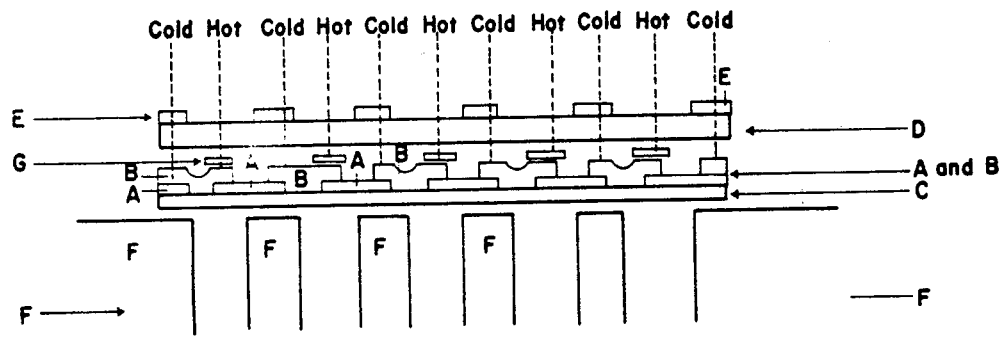
FIG. 4 is a schematical side view of the possible layers comprising the detector.

The pattern of the rectangles A and B defines a plurality of hot junctions 13 and of cold junctions 14. Advantageously there is superpositioned above said junctions 14 a plurality of parallel strips 15, illustrated in FIG. 2, adapted to create a pattern of shade above the cold junctions of the thermopile. A similar pattern is advantageously used for a heat-sink provided below the substrate C. A device of this type is also illustrated with reference to FIG. 4, where A and B are the rectangular deposits of the two different materials, such as copper and Bismuth, deposited on the thin substrate C. A plurality of reflecting strips E is provided so as to shade the cold junctions, said strips E being deposited on a thin transparent insulating layer D. Beneath the substrate C there is provided a heat sink F. Advantageously there is provided a plurality of blackened strips G, above the hot junctions of the thermocouple junctions. The rectangles are interconnected in series, the first and the last of these being provided with means 11 and 12 for connection to the measuring device.

The thin deposits on the inert substrate are advantageously deposited by vapor-deposition on sputtering techniques or by any other conventional technique used for the production of small electronic components. The rectangles of one material may be formed by selectively etching it from above a continuous meandering path of the second material by conventional photolithographic techniques. Thus, simplifying the production since both the materials can be evaporated one on top of the other without removal from the vacuum chamber and exposure to contamination.

A device according to the invention was built which consists of 400 rectangular deposits of 100 microns length each of copper, the first deposit being a continuous meandering path of 2500 A layer of Bismuth on an inert carrier, the subsequent deposit being of rectangles of copper of 2000 A thickness, the distance between consecutive rectangles being about 100 microns. The device comprises 20 rows of 40 junctions each, connected in series so as to define a consecutive path through all the thermocouple junctions. The cold junctions were shielded by means of reflecting strips of aluminum of 100 microns width and at a distance of about 200 microns from each other. Thus, such device comprises 400 hot and 400 cold junctions. Its response time is in the range of 1–10 KHz in the I.R. range of about 10.6 microns. The responsitivity is about 2 V/W and the noise equivalent power is $10^{-8}$ W $\sqrt{VHz}$.

Figure 5:
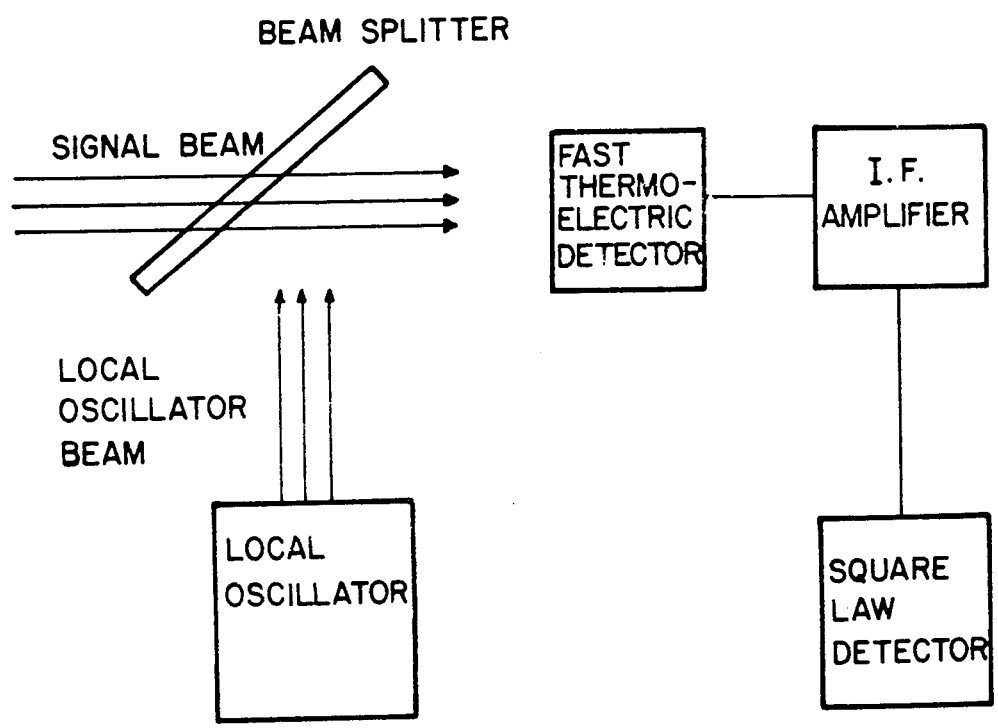
FIG. 5 illustrates the use of the detector in a heterodyne detection system.

The novel thermoelectric detectors can be used for heterodyne detection according to the technique described by Teich, Proc. IEEE 56, (1968) 37–46, the setup being illustrated in FIG. 5.

The pattern of the plurality of thermoelectric junctions and the addition of the specific patterns of some, or all, of heat sink tunnels, shadowing reflective strips of focusing means make the novel device different from conventional thermopiles and similar devices. The large number of thermojunctions arranged in the method and specific patterns described herein leads to fast and efficient measurement of incoming radiation.

Figure 6:
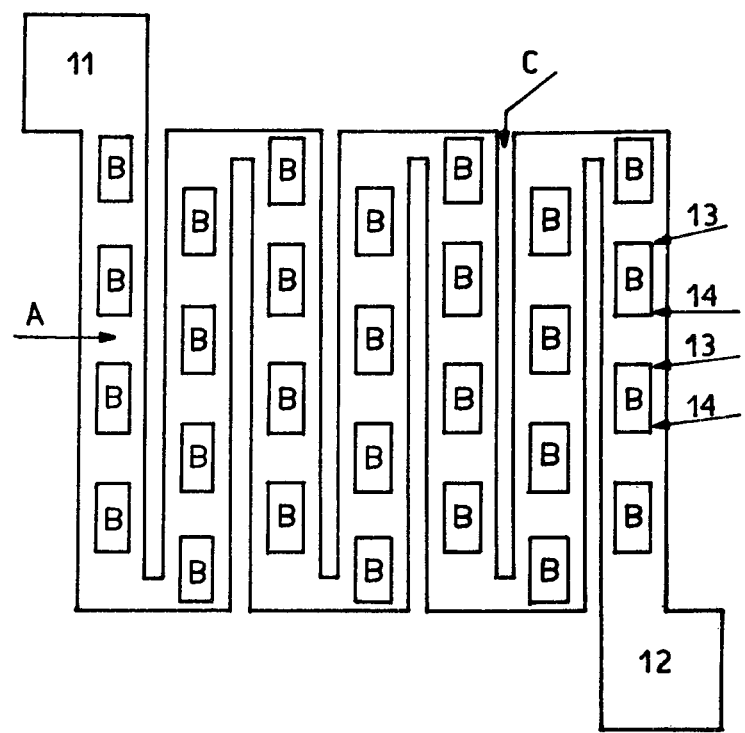
FIG. 6 is a schematical top view of the detector coatings with one material defining a continuous meandering path, and the other a white squares pattern of a chess board.

A specific embodiment of the present invention is illustrated with reference to FIG. 6.

According to this embodiment a conductive material A is deposited on a suitable substrate, and this material A defines a meandering path extending between the one terminal 11 and the second, 12. On this material A there are provided a plurality of substantially rectangular deposits B of a material different from that of A. The two material A and B are chosen is such manner that they constitute an effective thermal junction, the conductivity of A being lower than that of B. The drawing is not according to scale, and it ought to be clear that the "margins" adjacent the rectangles B are quite narrow. The rectangles B are arranged in such manner that these are in a staggered arrangement respective the rectangles in the consecutive row. When subjected to thermal radiation, a current starts to flow through the meandering ribbon-like path A, but as the conductivity of A is substantially lower that that of B, the current will preferably flow through B in those sections where such rectangles B are superpositioned on A and thus this will constitute thermal junctions. The overall effect is very much like that of a sequence of A-B-A . . . B-A and the resultant voltage differs but little from such an arrangement. The great advantage is the ease of production and also the fact that if there is any break between any of the connections A-B the overall performance of the device is not substantially affected as in this short part of the path the current will simply continue through A.

It is clear that this description is by way of example only and that many variations and modifications in the size and arrangement of parts can be resorted to. The support may be a plane surface or a curved one, the deposits can be in the form of squares, rectangles, ellipses, circles or the like, with suitable overlap defining the thermocouple junctions. Any suitable materials for thermocouples can be used, in any suitable dimension or thickness, as is apparent to those versed in the art.

We claim:

1. A fast thermoelectric detector comprising, in combination: a plurality of thermocouple junctions connected in series in a meandering path consisting of a plurality of rows, each row including a plurality of substantially reactangular deposits of two different thermoelectrically active materials having overlap between deposits of said different materials which define said junctions; a thin support structure, said deposits being located on said thin inert support structure; and a tunnel structure on a thermally conducting base and defining a plurality of tunnels, said support structure being above said tunnel structure and said tunnels being substantially perpendicular to said rows of said meandering path of said junctions, said tunnels being located beneath those of said junctions which are hot junctions and material of said base being in good thermal contact beneath those of said junctions which are cold junctions.

2. A thermoelectric detector according to claim 1, wherein one of said active materials has a higher electrical resistivity than the other of said actibe materials, said material of higher electrical resistivity being in the form of a continuous meandering path whereas the other active material is in the form of spaced rectangular deposits on said first material, centers of said spaced rectangular deposits being located respective to each other in a pattern, both ends of each of said spaced rectangular deposits defining said hot and cold junctions respectively, said hot junctions being located above respective said tunnels in said material of said base.

3. A detector according to claim 2, including focusing means provided for selective intensification of effects of incoming radiation and for focusing same on said hot junctions and for decreasing effect of radiation on said cold junctions, said focusing means being in form of plurality of miniature lenses of elongated shape and cylindrical form, said lenses being located above said thermoelectric materials with the cylindrical axis of each lens being parallel to said tunnels in said material of said base and located directly above the center line of each respective one of said tunnels.

4. A detection device according to claim 1, combined with means constituting parts of a heterodyne receiver, said detection device being the mixing element in said heterodyne receiver.

* * * * *